(12) United States Patent
Ring et al.

(10) Patent No.: US 9,761,439 B2
(45) Date of Patent: Sep. 12, 2017

(54) PECVD PROTECTIVE LAYERS FOR SEMICONDUCTOR DEVICES

(71) Applicant: Cree, Inc., Durham, NC (US)

(72) Inventors: Zoltan Ring, Chapel Hill, NC (US); Sei-Hyung Ryu, Cary, NC (US); Daniel Namishia, Wake Forest, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/568,919

(22) Filed: Dec. 12, 2014

(65) Prior Publication Data

US 2016/0172315 A1 Jun. 16, 2016

(51) Int. Cl.
| | |
|---|---|
| *H01L 21/02* | (2006.01) |
| *H01L 23/00* | (2006.01) |
| *C23C 16/02* | (2006.01) |
| *C23C 16/34* | (2006.01) |
| *C23C 16/509* | (2006.01) |

(52) U.S. Cl.
CPC ...... *H01L 21/0217* (2013.01); *C23C 16/0245* (2013.01); *C23C 16/345* (2013.01); *C23C 16/509* (2013.01); *H01L 21/022* (2013.01); *H01L 21/0214* (2013.01); *H01L 21/02211* (2013.01); *H01L 21/02274* (2013.01); *H01L 23/564* (2013.01); *H01L 2924/0002* (2013.01)

(58) Field of Classification Search
CPC ............... H01L 23/564; H01L 21/0214; H01L 21/0217; H01L 21/022; H01L 21/02274
See application file for complete search history.

(56) References Cited

U.S. PATENT DOCUMENTS

| | | | | |
|---|---|---|---|---|
| 6,107,096 A | * | 8/2000 | Mikagi ............. | H01L 21/28052 257/E21.165 |
| 6,211,083 B1 | * | 4/2001 | Yang ................. | H01L 21/28518 257/E21.165 |
| 6,251,775 B1 | * | 6/2001 | Armbrust ......... | H01L 21/76849 257/E21.508 |
| 6,790,778 B1 | * | 9/2004 | Cheng ............... | H01L 21/76834 257/E21.576 |

(Continued)

FOREIGN PATENT DOCUMENTS

JP      KR 2002054845 A   *   7/2002   ........... H01L 29/786

OTHER PUBLICATIONS

Hussein et al., "Optimization of plasma-enhanced chemical vapor deposition silicon oxynitride layers for integrated optics applications," Thin Solid Films 515 (2007) 3779-3786.*

(Continued)

*Primary Examiner* — Joseph C Nicely
(74) *Attorney, Agent, or Firm* — Anthony J. Josephson

(57) ABSTRACT

A semiconductor device includes a plasma-enhanced chemical vapor deposition (PECVD) protective layer configured to prevent failure of the semiconductor device throughout a temperature humidity with bias (THB) test exceeding about 1000 hours and/or a highly accelerated stress test (HAST) exceeding about 96 hours. Including a PECVD protective layer capable of protecting the semiconductor device throughout a THB test exceeding about 1000 hours and/or a HAST exceeding about 96 hours results in an extremely robust device, while providing the protective layer via PECVD results in convenience and cost savings.

15 Claims, 17 Drawing Sheets

(56) References Cited

U.S. PATENT DOCUMENTS

| | | | | |
|---|---|---|---|---|
| 2005/0158957 A1* | 7/2005 | Hwang | ............... | H01L 21/2236 438/299 |
| 2006/0024879 A1* | 2/2006 | Fu | ....................... | H01L 21/3185 438/216 |
| 2006/0076585 A1* | 4/2006 | Kato | ................... | H01L 27/0605 257/280 |
| 2007/0093013 A1* | 4/2007 | Chua | ................... | H01L 21/0214 438/197 |
| 2007/0123044 A1* | 5/2007 | Hohage | ............. | H01L 21/02074 438/687 |
| 2007/0243386 A1* | 10/2007 | Park | ....................... | C23C 16/345 428/411.1 |
| 2007/0263164 A1* | 11/2007 | Kumagai | ............ | H01L 27/3246 349/156 |
| 2008/0113521 A1* | 5/2008 | Tanaka | ................ | H01L 21/3185 438/792 |
| 2008/0150145 A1* | 6/2008 | King | ................. | H01L 21/76807 257/762 |
| 2010/0032643 A1* | 2/2010 | Xu | ....................... | H01L 45/1641 257/4 |
| 2012/0056191 A1* | 3/2012 | Endo | ................. | H01L 21/30612 257/76 |
| 2013/0040163 A1* | 2/2013 | Chiang | ................. | B22D 19/04 428/613 |
| 2013/0092947 A1* | 4/2013 | Green | ............... | H01L 21/28264 257/76 |
| 2013/0092967 A1* | 4/2013 | Ohbayashi | ............. | H01L 33/56 257/98 |
| 2013/0200367 A1* | 8/2013 | Yamazaki | ......... | H01L 29/41733 257/43 |
| 2014/0062906 A1* | 3/2014 | Park | ........................ | G06F 3/041 345/173 |
| 2014/0103360 A1* | 4/2014 | Hikita | ................ | H01L 29/66212 257/76 |
| 2014/0151842 A1* | 6/2014 | Kim | ...................... | H01L 23/564 257/503 |
| 2014/0167114 A1* | 6/2014 | Derluyn | .............. | H01L 29/0649 257/194 |
| 2016/0091616 A1* | 3/2016 | Homma | ................ | G01T 1/2018 250/361 R |
| 2016/0097123 A1* | 4/2016 | Shugrue | ............ | C23C 16/45544 427/255.28 |

OTHER PUBLICATIONS

Oxford, "Basic PECVD Plasma Processes (SiH4 based)," 2003, http://wcam.engr.wisc.edu/Public/Reference/Deposition/PECVD %20of%20silicon%20nitride%20and%20oxide.pdf.*

* cited by examiner

PECVD PROTECTIVE LAYERS FOR SEMICONDUCTOR DEVICES

FIELD OF THE DISCLOSURE

The present disclosure relates to protective layers for semiconductor devices and methods for manufacturing the same.

BACKGROUND

Semiconductor devices are used in a broad range of electronic devices deployed in a variety of environments. In order to meet the constantly increasing performance demands of modern electronic devices, these semiconductor devices are often pushed to the limits of their physical performance, resulting in semiconductor devices with precise geometries, new and complex materials systems, and operational parameters that may be highly sensitive to environmental interference. Accordingly, it is paramount to provide one or more protective layers over or around the semiconductor device in order to isolate the semiconductor device from the external environment and/or provide passivation for one or more semiconductor layers of the device that may otherwise attract and bond to environmental contaminants. Although there are many different ways to provide passivation and/or environmental encapsulation layers for a semiconductor device, plasma-enhanced chemical vapor deposition (PECVD) has emerged as a preferred method for providing these layers due to the convenience and cost associated therewith. However, PECVD protective layers often include pinholes, cracks, or other structural damage that limit the ability of the layers to protect an underlying device.

Accordingly, there is a need for PECVD protective layers with improved passivation and/or environmental encapsulation capabilities and methods of manufacturing the same.

SUMMARY

The present disclosure relates to protective layers for semiconductor devices and methods of manufacturing the same. In one embodiment, a semiconductor device includes a plasma-enhanced chemical vapor deposition (PECVD) protective layer configured to prevent failure of the semiconductor device throughout a temperature humidity with bias (THB) test exceeding about 1000 hours. Including a PECVD protective layer capable of protecting the semiconductor device throughout a THB test exceeding about 1000 hours results in an extremely robust device, while providing the protective layer via PECVD results in convenience and cost savings.

In one embodiment, the PECVD protective layer is configured to prevent failure of the semiconductor device throughout a THB test exceeding about 1500 hours. The THB test may be performed at about 85° C. and 85% relative humidity. Further, the semiconductor device may be a transistor, and the THB test may involve biasing the device with about −8V between a gate contact and a source contact of the device and about 50V at a drain contact of the device.

In one embodiment, the semiconductor device is a silicon nitride (SiN) or a gallium nitride (GaN) device. The PECVD layer may also be a silicon nitride (SiN) layer. In additional embodiments, the PECVD layer is a silicon-oxy-nitride layer (SiON), or includes multiple alternating layers of silicon nitride (SiN) and silicon-oxy-nitride (SiON).

In one embodiment, a semiconductor device includes a PECVD protective layer configured to prevent failure of the semiconductor device throughout a highly accelerated stress test (HAST) exceeding about 96 hours. Including a PECVD protective layer capable of protecting the semiconductor device throughout a HAST exceeding about 96 hours results in an extremely robust device, while providing the protective layer via PECVD results in convenience and cost savings.

In one embodiment, the PECVD protective layer is configured to prevent failure of the semiconductor device throughout a HAST exceeding about 144 hours. In an additional embodiment, the PECVD protective layer is configured to prevent failure of the semiconductor device throughout a HAST exceeding about 192 hours.

In one embodiment, a method of manufacturing a semiconductor device includes the steps of providing the semiconductor device in a PECVD chamber and providing a PECVD protective layer over the semiconductor device. Notably, the PECVD protective layer is configured to prevent failure of the semiconductor device throughout a THB test exceeding about 1000 hours.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
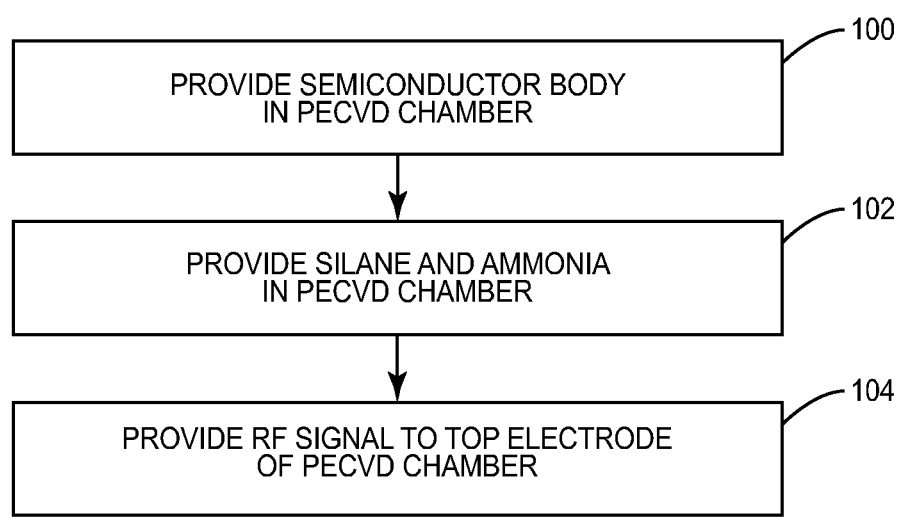
FIG. 1 is a block diagram describing a process for providing a protective layer for a semiconductor device via plasma-enhanced chemical vapor deposition (PECVD).

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 2A:
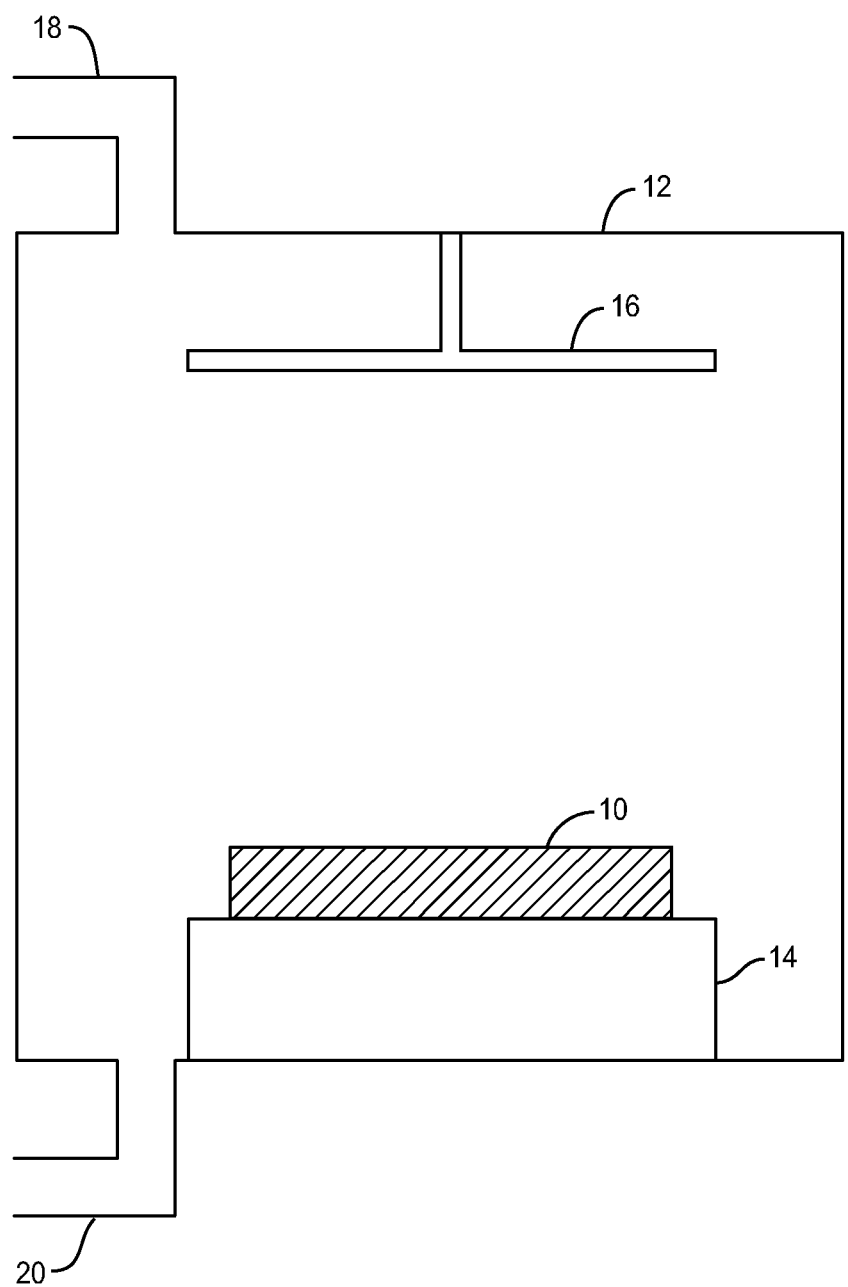
FIGS. 2A-2C illustrate the process for providing a protective layer for a semiconductor device described in FIG. 1.
Figure 2B:
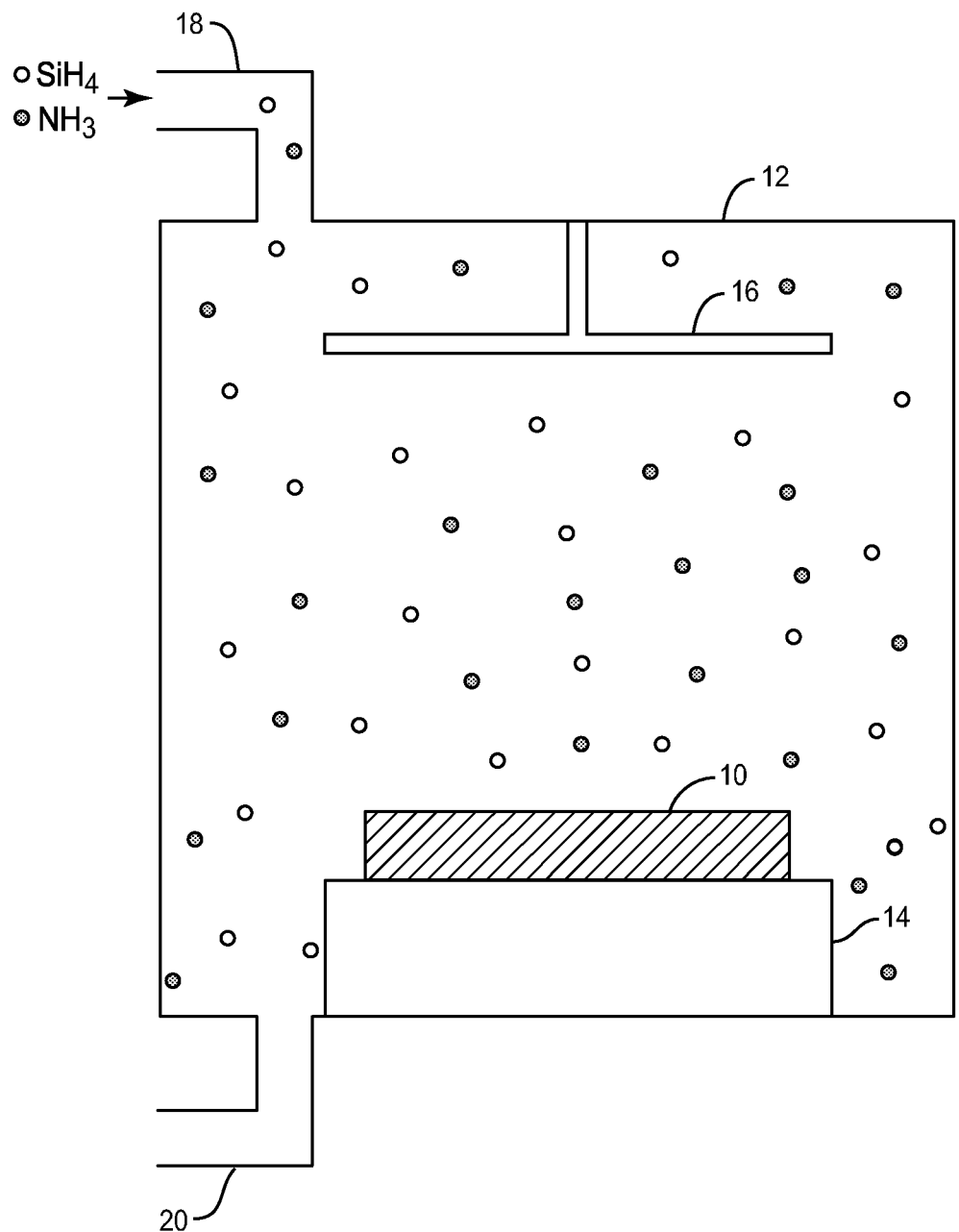
Figure 2C:
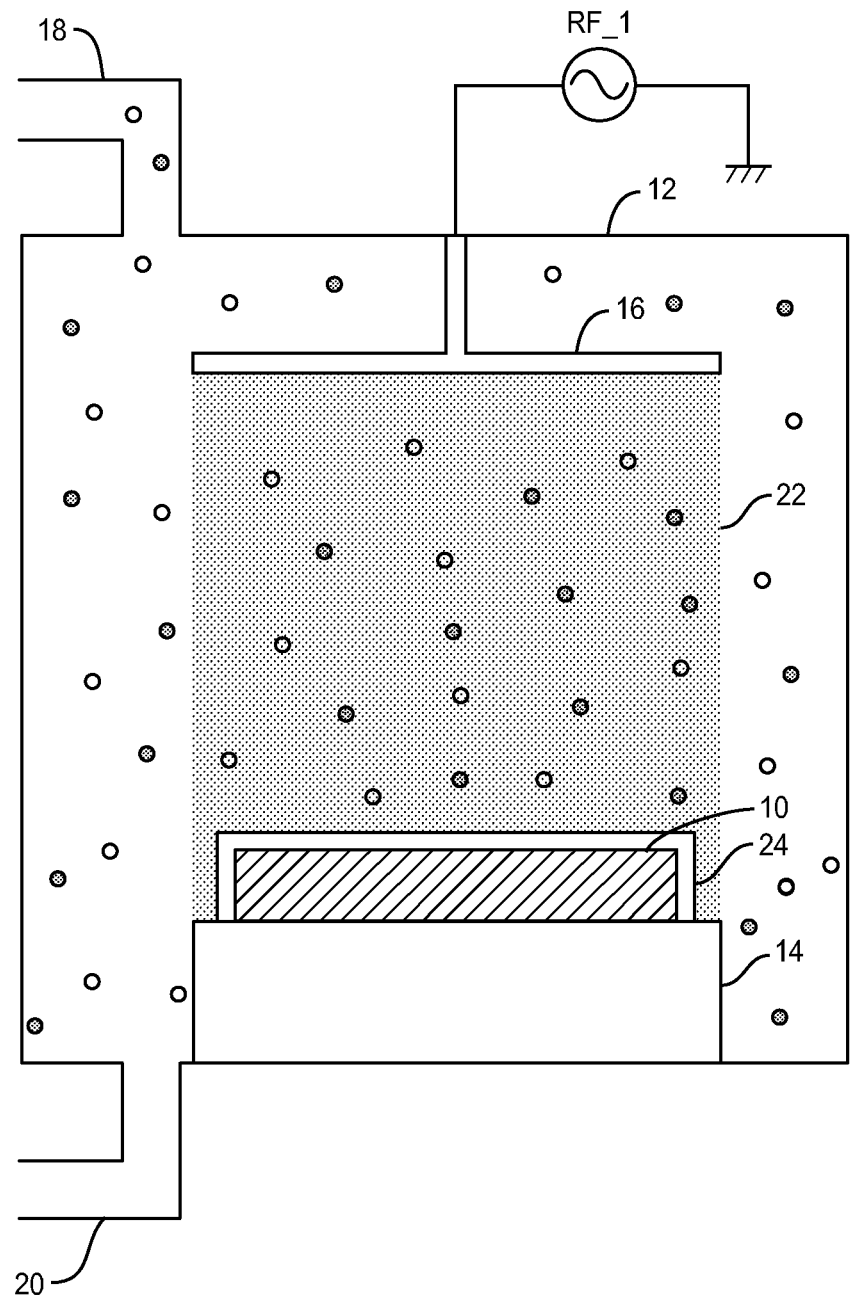
Figure 3:
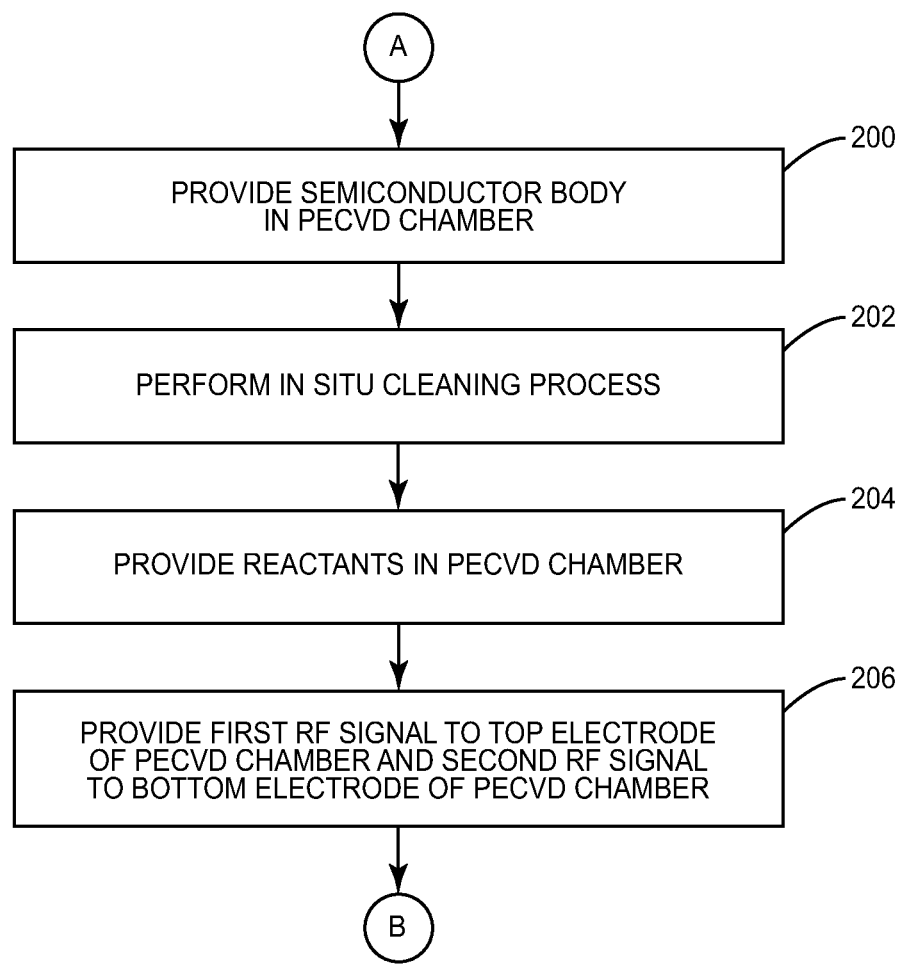
FIG. 3 is a block diagram describing a process for providing a protective layer for a semiconductor device via PECVD according to one embodiment of the present disclosure.

FIG. 1 and corresponding FIGS. 2A through 2C show a process for providing a protective layer on a semiconductor device. First, a semiconductor body 10 is provided in a PECVD chamber 12 (step 100 and FIG. 2A). Generally, the semiconductor body 10 is placed on a dedicated platform 14 in the PECVD chamber 12 such that the dedicated platform 14 and thus the semiconductor body 10 are directly below a top electrode 16 within the PECVD chamber 12. Silane ($SiH_4$) and ammonia ($NH_3$) are then introduced into the PECVD chamber 12, for example, via a gas input port 18 (step 102 and FIG. 2B). Finally, a radio frequency (RF) signal is provided to the top electrode 16 of the PECVD chamber 12 (step 104 and FIG. 2C). Providing an RF signal to the top electrode 16 effectively ionizes the silane ($SiH_4$) and ammonia ($NH_3$) in the PECVD chamber 12, thereby creating a plasma 22 represented by the shaded area of FIG. 2C which deposits a protective layer 24 of silicon nitride ($Si_3N_4$) over the semiconductor body 10. Any remaining reactants in the PECVD chamber 12 are then removed, for example via an exhaust port 20 before proceeding with one or more additional steps in the semiconductor manufacturing process.

FIGS. 3 and 4A through 4E illustrate a process for providing a protective layer for a semiconductor device according to one embodiment of the present disclosure. First, a semiconductor body 26 is placed in a plasma-enhanced chemical vapor deposition (PECVD) chamber 28 (step 200 and FIG. 4A). As defined herein, a semiconductor body 26 is the main portion of a semiconductor device, which may include any number of semiconductor device layers and a portion used to transport charge carriers in the device. Accordingly, the semiconductor body 26 could be the main portion of a semiconductor device such as a field-effect transistor (FET), a metal-oxide-semiconductor FET (MOSFET), a bipolar junction transistor (BJT), a high-electron mobility transistor (HEMT), a metal-semiconductor FET (MESFET), or the like. The semiconductor body may be made from any suitable materials system such as silicon nitride (SiN), gallium nitride (GaN), gallium arsenide (GaAs), or the like. Further, the semiconductor body 26 may include one or more contacts such as a gate contact, a drain contact, and a source contact in the case of a FET device or a base contact, a collector contact, and an emitter contact in the case of a BJT. In general, it may be desirable to provide a protective layer over any number of layers in a semiconductor device during one or more stages of manufacturing of the semiconductor device for purposes of environmental encapsulation or passivation. Accordingly, the semiconductor body 26 may be any portion of a semiconductor device at any number of stages in the manufacturing process. The PECVD chamber 28 includes a gas input port 30, an exhaust port 32, a top electrode 34, and a bottom electrode 36 on which the semiconductor body 26 is placed.

Figure 4A:
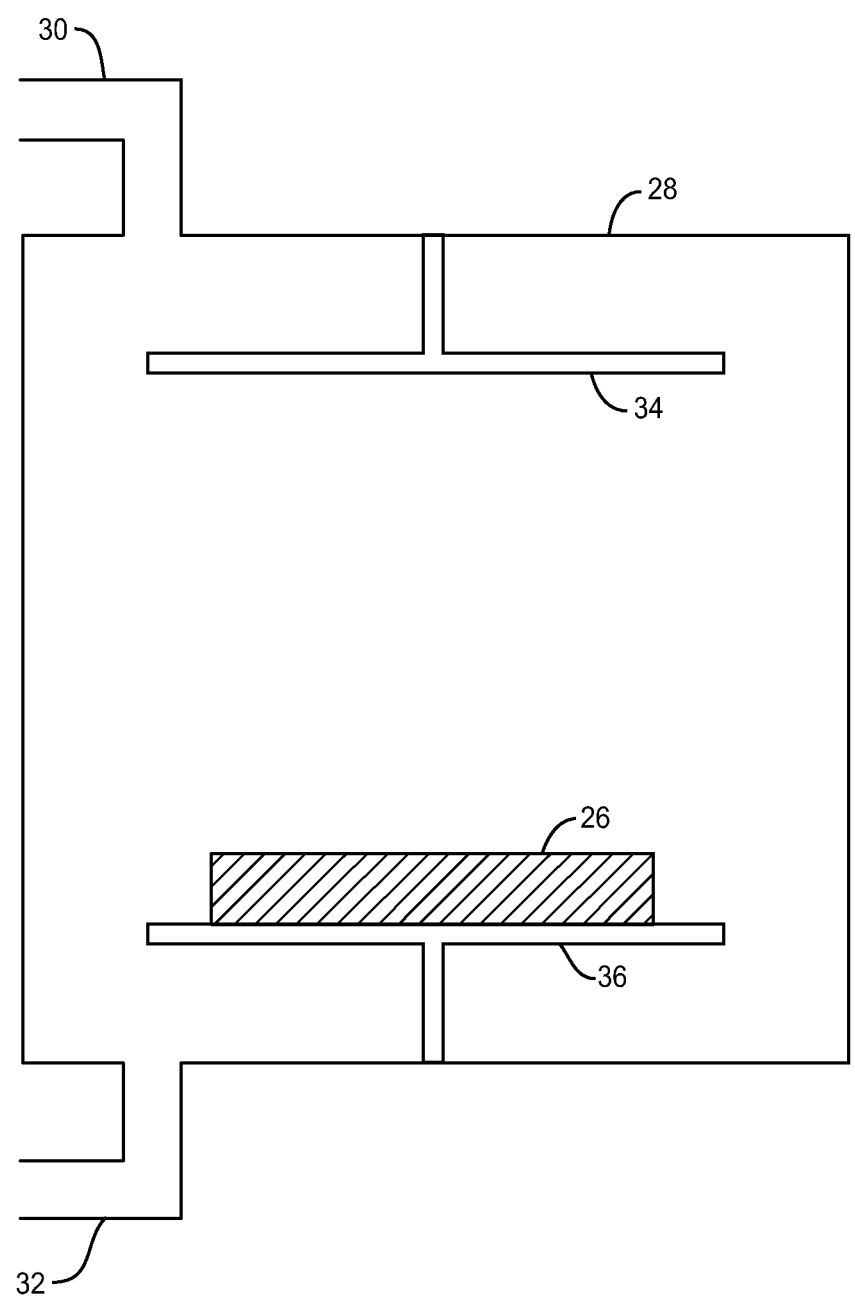
FIGS. 4A-4E illustrate the process for providing a protective layer for a semiconductor device described in FIG. 3.
Figure 4B:
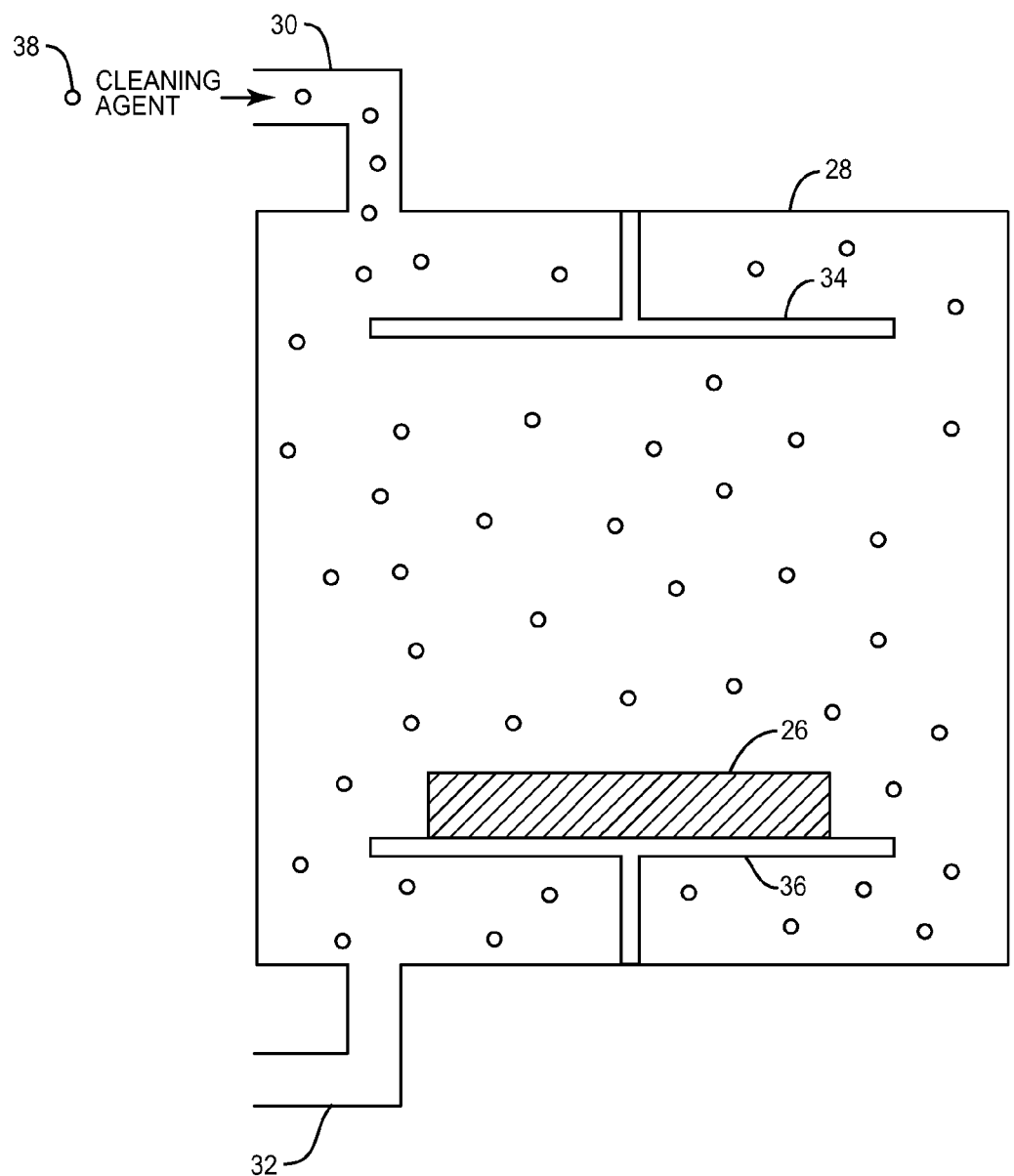
Figure 4C:
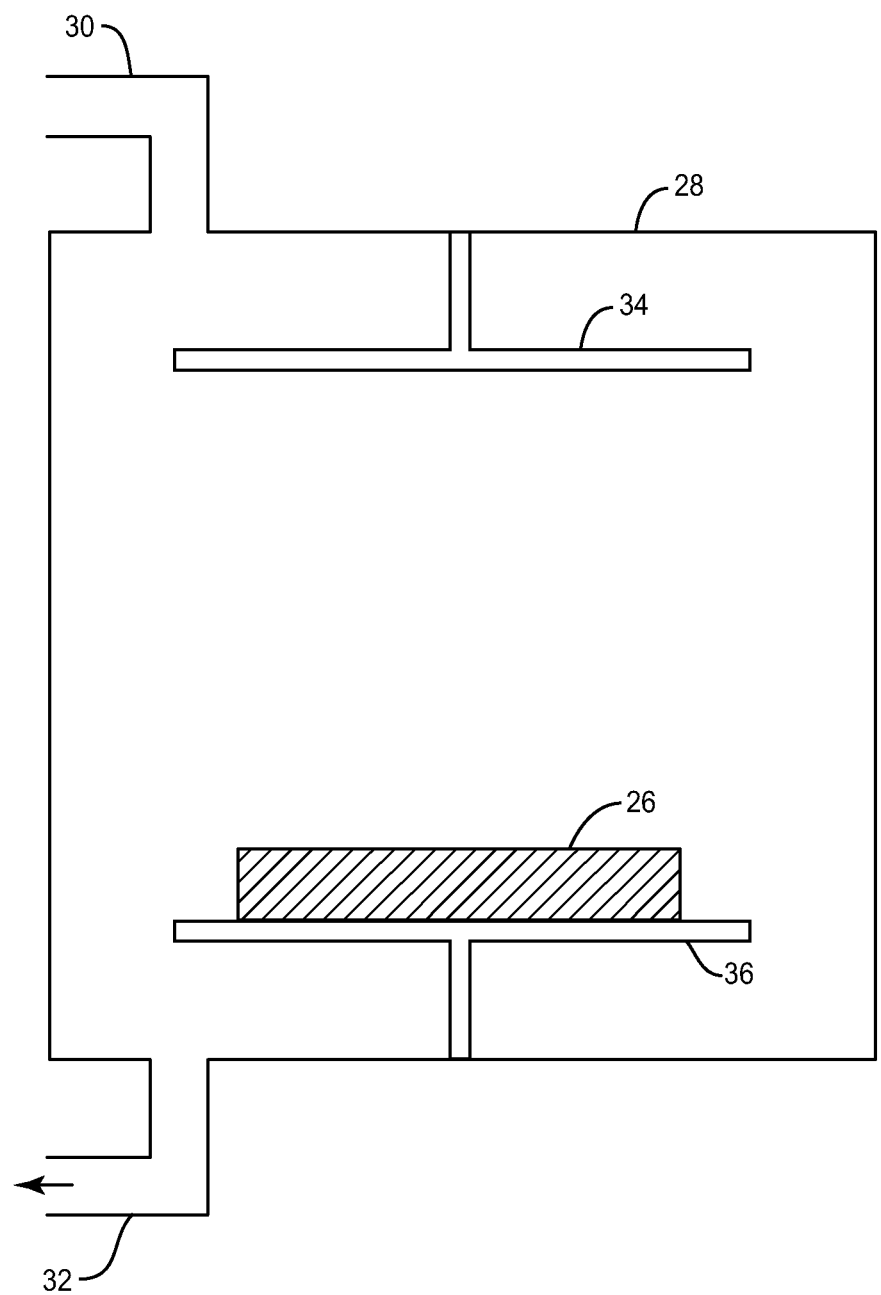

Next, an in situ cleaning process is performed on the semiconductor body 26 (step 202 and FIGS. 4B and 4C). As defined herein, an in situ cleaning process is a cleaning process performed on the semiconductor body 26 within the PECVD chamber 28. Performing a cleaning process on the semiconductor body 26 inside the PECVD chamber 28 prevents exposure of the semiconductor body 26 to environmental contaminants that may be accumulated during the transport of the semiconductor body 26 from a separate cleaning location to the PECVD chamber 28 before deposition of a protective layer discussed below. In one embodiment, performing the in situ cleaning includes providing a cleaning agent 38 into the PECVD chamber 28, for example, via the gas input port 30 as shown in FIG. 4B. In one embodiment, the cleaning agent 38 is ammonia ($NH_3$); however, any suitable cleaning agent may be used without departing from the principles of the present disclosure. In general, the cleaning agent may be any material that will clean the exposed surfaces of the semiconductor body 26 such that the exposed surfaces are uniform and relatively free of environmental contaminants that may interfere with the deposition of a protective layer. After the cleaning agent 38 has been provided and given time to suitably react with and thus clean the exposed surfaces of the semiconductor body 26, the cleaning agent 38 may then be removed from the PECVD chamber 28, for example, via the exhaust port 32 as shown in FIG. 4C.

Figure 4D:
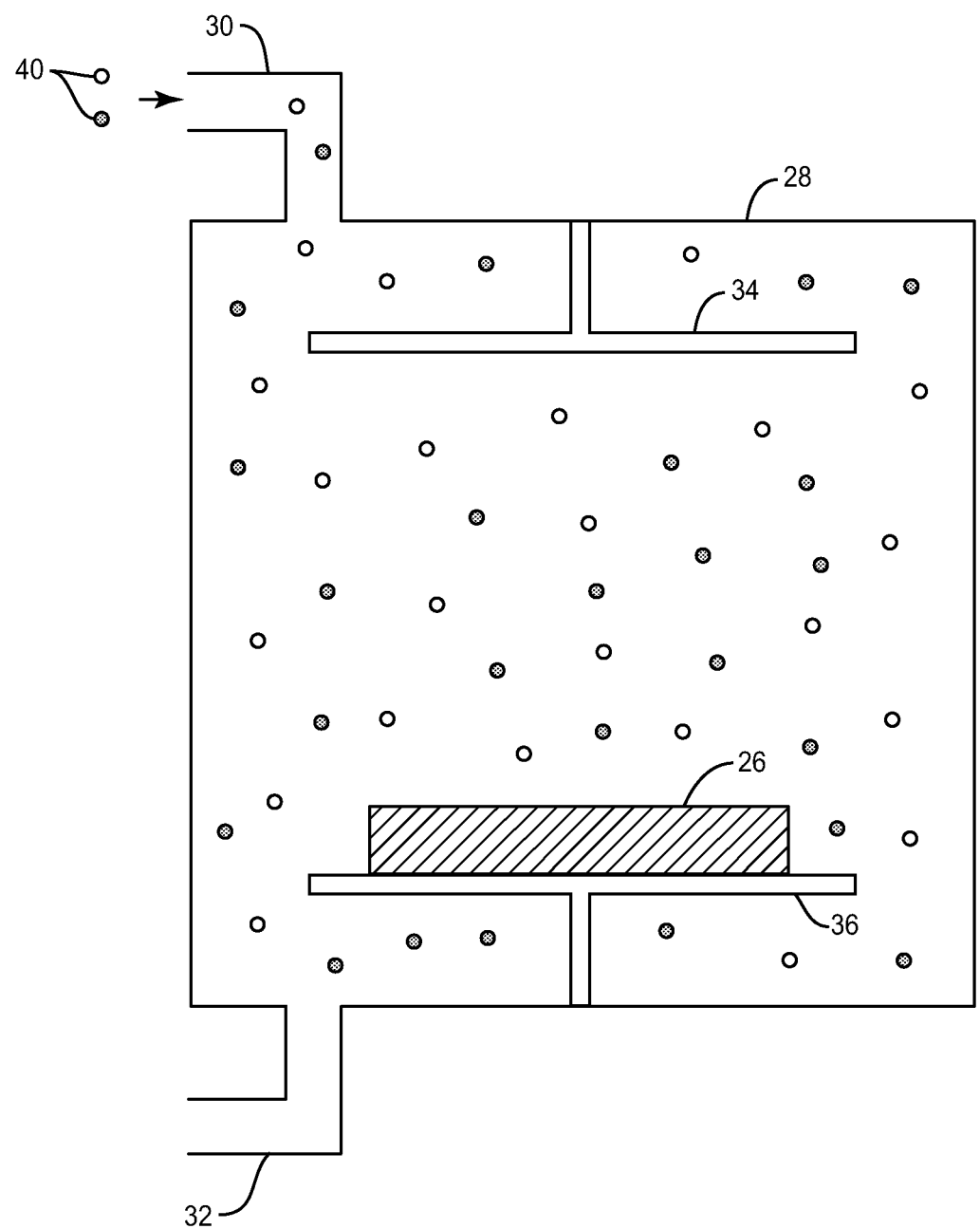

Next, one or more reactants 40 are provided into the PECVD chamber 28, for example, via the gas input port 30 (step 204 and FIG. 4D). In one embodiment, the reactants are silane ($SiH_4$) and nitrogen ($N_2$), resulting in a silicon nitride (SiN) protective layer. However, while the present disclosure primarily discusses the use of silane ($SiH_4$) and nitrogen ($N_2$) as the primary reactants used to form a protective layer, any suitable reactants may be used without departing from the principles of the present disclosure.

While using silane ($SiH_4$) and nitrogen ($N_2$) may provide numerous benefits apparent in the resulting protective layer, nitrogen ($N_2$) is much less reactive in the PECVD process than, for example, ammonia ($NH_3$). In many PECVD processes, ammonia ($NH_3$) has been widely utilized due to the ease with which it is ionized. In contrast, it is quite difficult to generate a similar number of ions from nitrogen ($N_2$). Accordingly, the inventors discovered that a large amount of nitrogen ($N_2$) generally must be used to form an adequate protective layer. In one embodiment, the ratio of silane ($SiH_4$) to nitrogen ($N_2$) is about 1:1000. In other words, the reactants are between about 0.1% and 1% silane ($SiH_4$) and about 99% and 99.9% nitrogen ($N_2$).

In one embodiment, the reactants are silane ($SiH_4$), oxygen ($O_2$), and nitrogen ($N_2$), thereby forming a silicon-oxy-nitride (SiON) protective layer. Providing oxygen ($O_2$) in addition to silane ($SiH_4$) and nitrogen ($N_2$) may reduce stress in the resulting protective layer, which may prevent warping and buckling of the layer as well as delamination and/or cracks in the surface of the layer due to warping and buckling. As discussed below, protective layers of different compositions, for example, those including oxygen and those without, may be alternated in order to disrupt imperfections formed in one or more of the layers and thus result in a more robust protective layer. In one embodiment, at least two protective layers of alternating compositions are used. In another embodiment, as many as 100 alternating layers are used. In one embodiment, the reactants are between about 0.1% and 1% silane ($SiH_4$), 0.1% and 1% oxygen ($O_2$), and about 99% and 99.9% nitrogen ($N_2$). The protective layer(s) may be as little as 200 Å thick and as much as 20,000 Å thick.

Figure 4E:
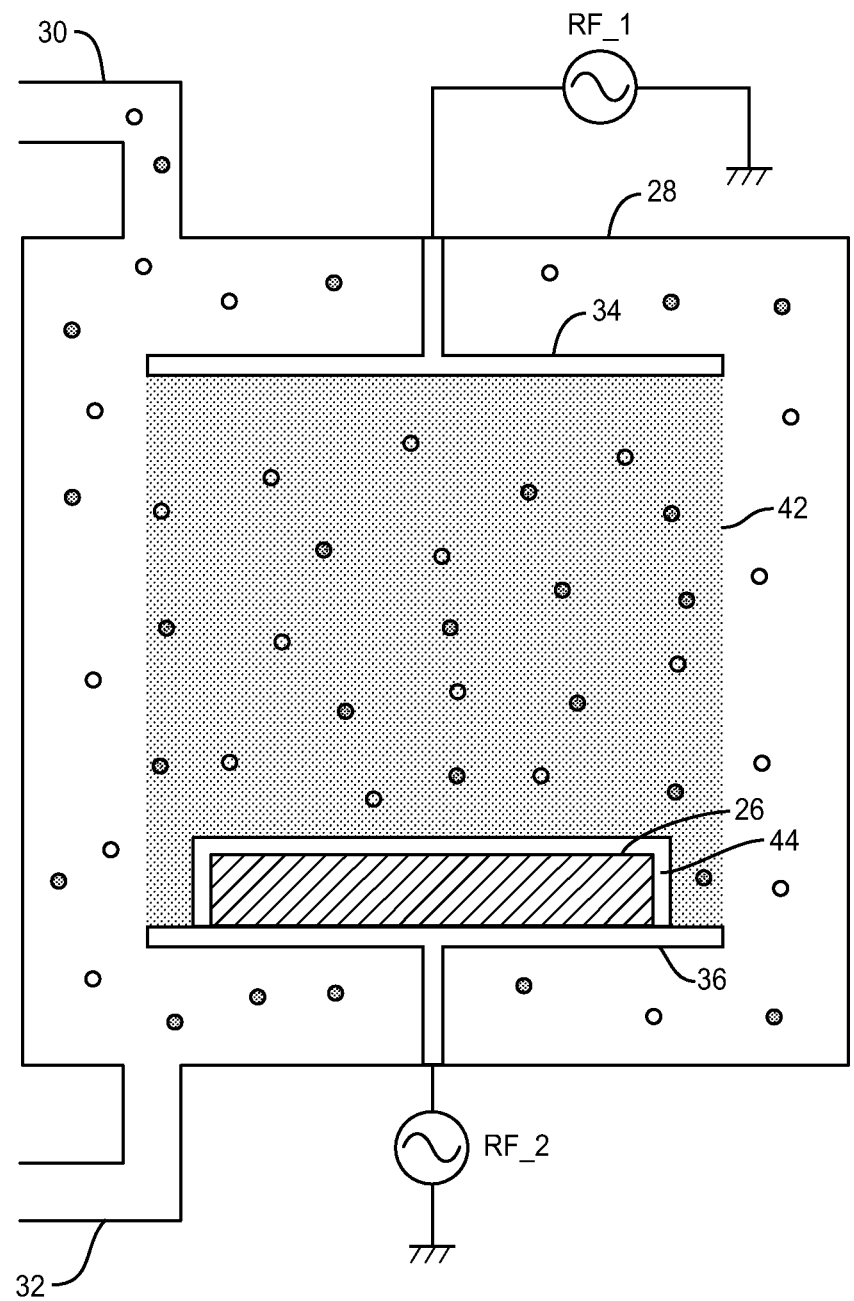
Figure 5:
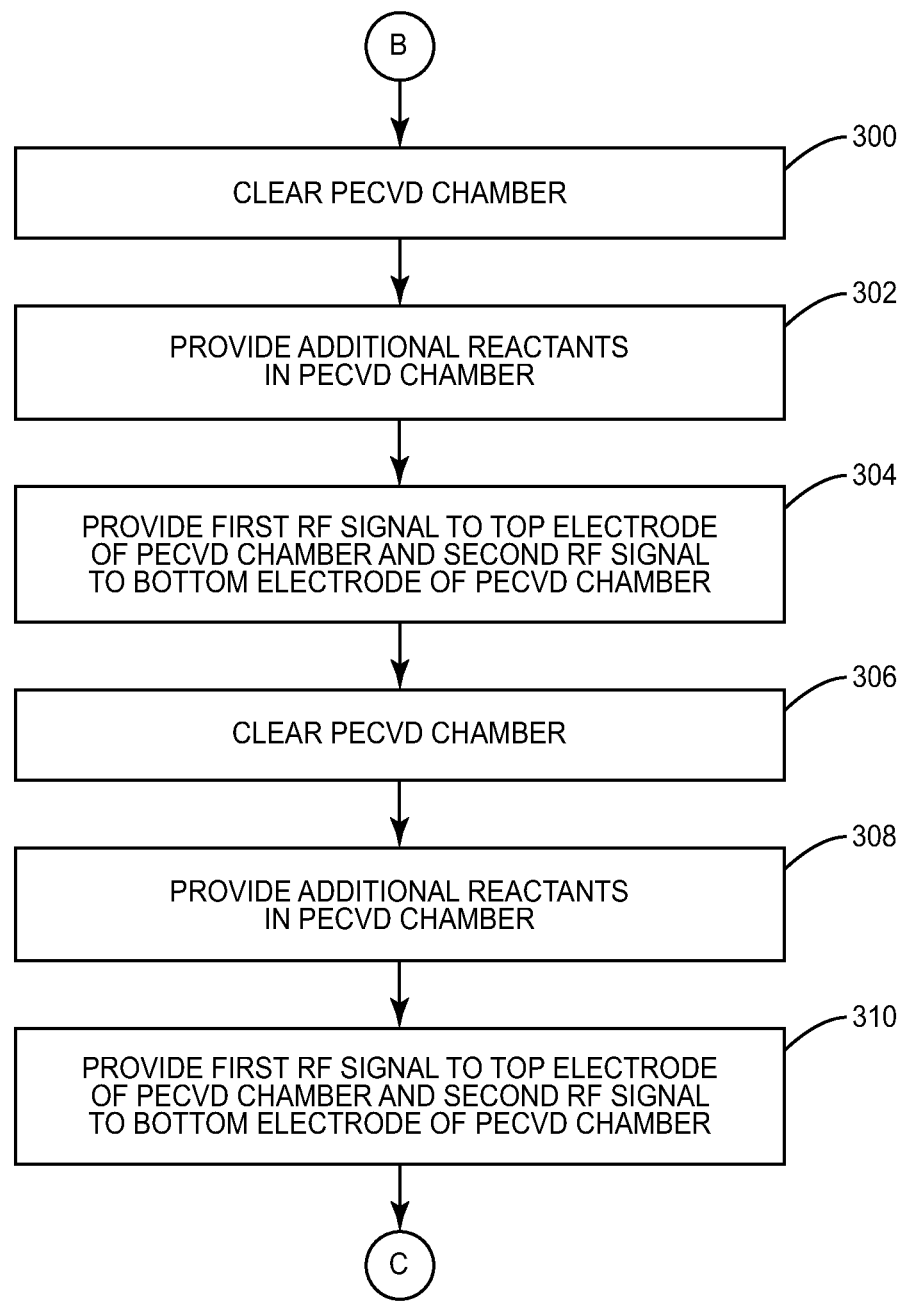
FIG. 5 illustrates additional aspects of the process for providing a protective layer for a semiconductor device described in FIG. 3 according to an embodiment of the present disclosure.

A first radio frequency (RF) signal RF_1 is then provided to a top electrode 34 of the PECVD chamber 28 (step 206 and FIG. 4E). The first RF signal RF_1 effectively ionizes the reactants in the PECVD chamber 28 and thus forms a plasma 42 below the top electrode 34, represented by the shaded area in FIG. 4E. The resulting reactive radicals, ions, and neutral atoms interact with the semiconductor body 26 to deposit a first protective layer 44 over the semiconductor body 26. In one embodiment, a second RF signal RF_2 is simultaneously provided to a bottom electrode 36 of the PECVD chamber 28 on which the semiconductor body 26 is provided. The first RF signal RF_1 may be a high frequency RF signal with a frequency of about 13.45 MHz while the second RF signal RF_2 may be a low frequency RF signal with a frequency of about 20 kHz. Further, the first RF signal RF_2 may be a low power RF signal, such that the power distribution on the bottom electrode 36 is about 0.16667 W/in$^2$. Providing the second RF signal RF_2 to the bottom electrode 36 may accelerate the various ions and reactive radicals into the semiconductor body 26, essentially resulting in ion bombardment of the semiconductor body 26. This ion bombardment has a compacting effect on the first protective layer 44 and therefore reduces stress in the layer. Accordingly, providing the second RF signal RF_2 to the bottom electrode 36 may reduce buckling and warping of the first protective layer 44 as well as delamination and/or cracks in the surface of the layer due to warping and buckling.

The first protective layer 44 may be used as a passivation layer to cover one or more reactive surfaces of the semiconductor body 26 or as an environmental encapsulation layer. Further, the first protective layer 44 may be provided numerous times through the manufacture of a semiconductor device such that the first protective layer 44 is located between various layers of the semiconductor device.

Figure 6A:
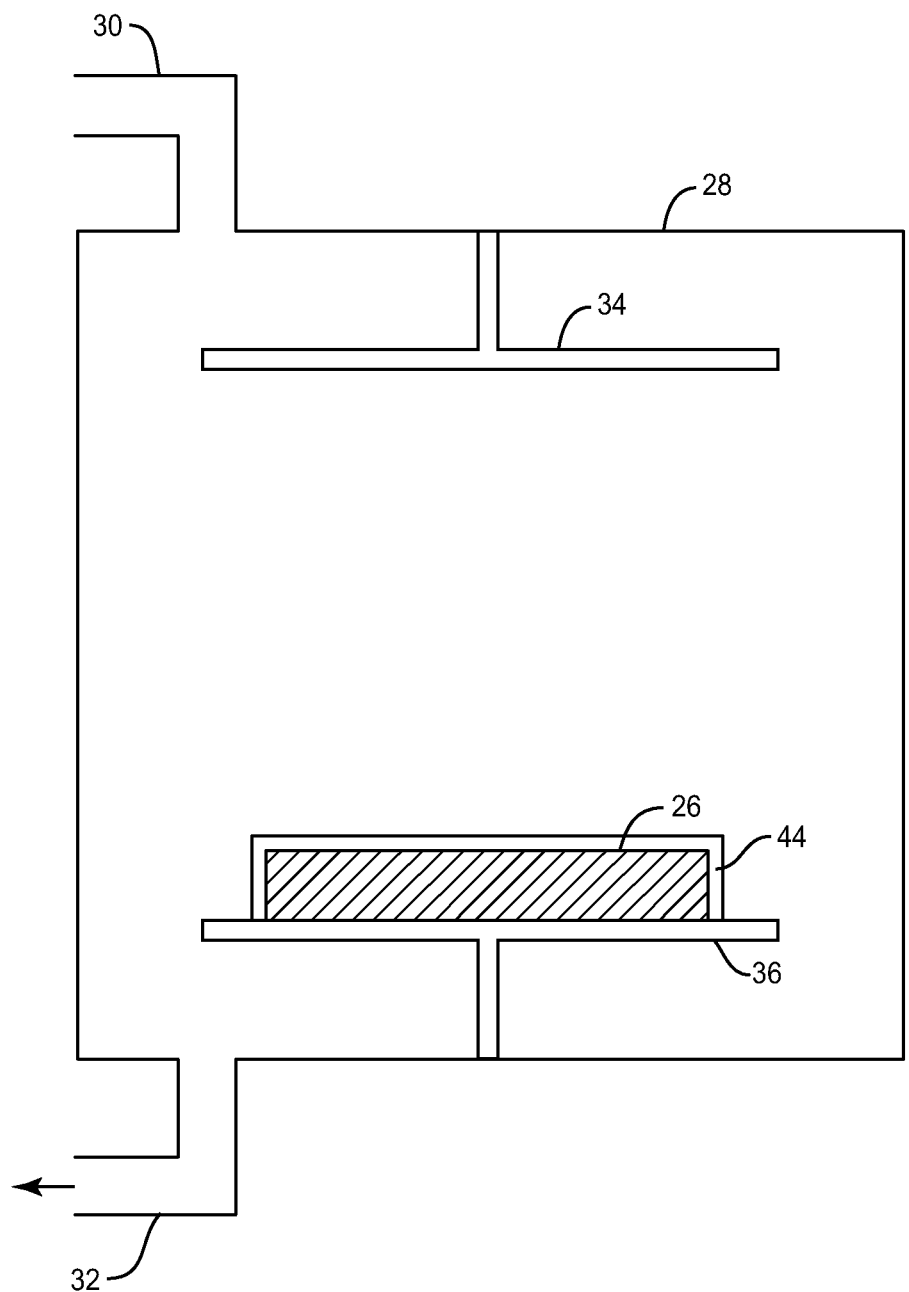
FIGS. 6A-6F illustrate the additional aspects of the process for providing a protective layer for a semiconductor device described in FIG. 5 according to one embodiment of the present disclosure.
Figure 6B:
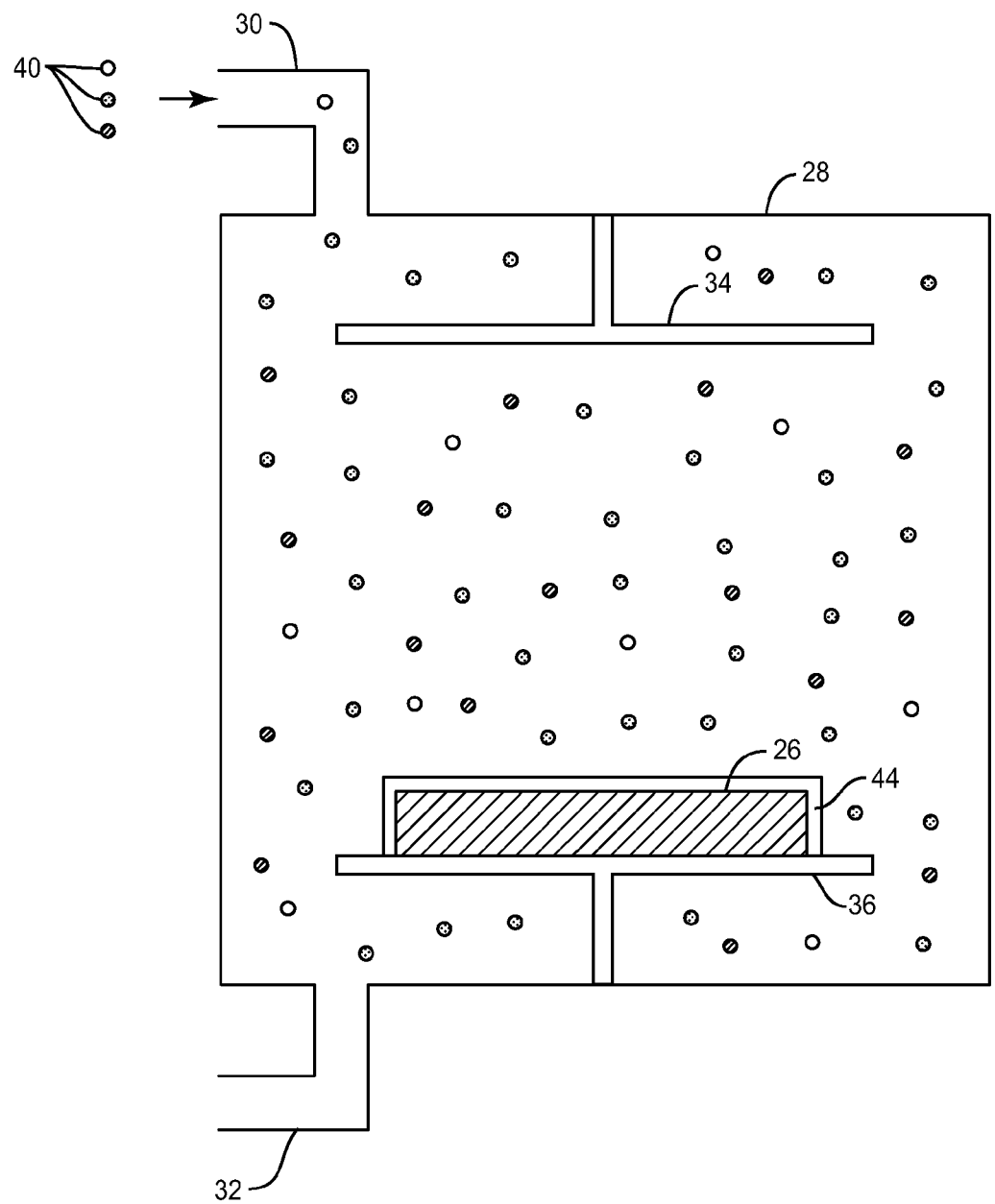

While the process described in FIGS. 3 and 4A through 4E may be used by itself to form a complete protective layer for the semiconductor body 26, the first protective layer 44 may be further enhanced with one or more additional layers in some embodiments. Accordingly, FIGS. 5 and 6A through 6F illustrate a process for further enhancing the first protective layer 44 with additional layers. First, the reactants used to form the first protective layer 44 are cleared from the PECVD chamber 28 (step 300 and FIG. 6A). In one embodiment, clearing the reactants used to form the first protective layer 44 from the PECVD chamber 28 includes removing the reactants via the exhaust port 32, as shown in FIG. 6A. Next, additional reactants are provided into the PECVD chamber 28 (step 302 and FIG. 6B). Notably, the additional reactants are different from the reactants used to form the first protective layer 44. In one embodiment wherein the reactants used to form the first protective layer 44 are silane ($SiH_4$) and nitrogen ($N_2$), the additional reactants are one or more of silane ($SiH_4$), nitrous oxide ($N_2O$), oxygen ($O_2$), and nitrogen ($N_2$). Using different reactants than those used to form a previous protective layer results in a protective layer of a different composition formed over the first protective layer 44, as discussed in further detail below. Accordingly, the further growth and proliferation of defects present in the first protective layer 44 may be stopped by the additional protective layer.

Figure 6C:
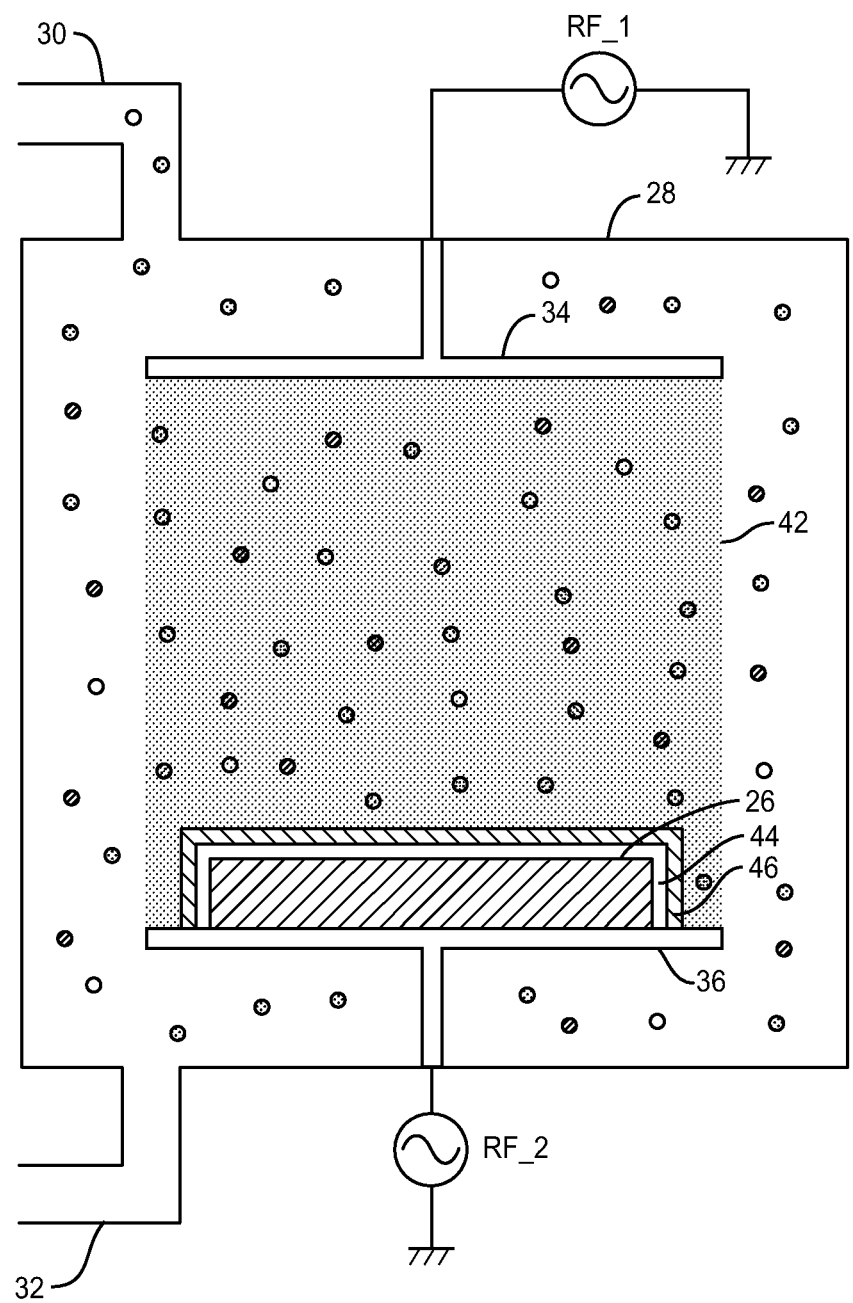

A first RF signal RF_1 is then provided to the top electrode 34 of the
PECVD chamber 28 (step 304 and FIG. 6C). As discussed above, the first RF signal RF_1 effectively ionizes the reactants in the PECVD chamber 28 and thus forms a plasma 42 below the top electrode 34, represented by the shaded area in FIG. 6C. The resulting reactive radicals, ions, and neutral atoms interact with the first protective layer 44 to deposit a second protective layer 46 over the first protective layer 44. In one embodiment, a second RF signal RF_2 is simultaneously provided to the bottom electrode 36 of the PECVD chamber 28 on which the semiconductor body 26 is provided. The first RF signal RF_1 may be a high frequency RF signal with a frequency of about 13.45 MHz while the second RF signal RF_2 may be a low frequency RF signal with a frequency of about 20 kHz. Providing the second RF signal RF_2 to the bottom electrode 36 may accelerate the various ions and reactive radicals into the first protective layer 44 and the semiconductor body 26, essentially resulting in ion bombardment of the first protective layer 44 and the semiconductor body 26. This ion bombardment has a compacting effect on the second protective layer 46 and thus reduces stress in the layer. Accordingly, providing the second RF signal RF_2 to the bottom electrode 36 may reduce buckling and warping of the second protective layer 46 as well as delamination and/or cracks in the surface of the layer due to warping and buckling. The first RF signal RF_1 and the second RF signal RF_2 may be the same as those used above to deposit the first protective layer 44, or may differ based on the reactants used to deposit the various protective layers.

Although the discussion above begins with a first protective layer 44 formed from silane ($SiH_4$) and nitrogen ($N_2$) such that the first protective layer 44 is a silicon nitride (SiN) layer, the first protective layer 44 may also be formed from silane ($SiH_4$), oxygen ($O_2$), and nitrogen ($N_2$) such that the first protective layer is a silicon-oxy-nitride (SiON) layer. In such a case, the second protective layer 46 may be formed from silane ($SiH_4$) and nitrogen ($N_2$) rather than silane ($SiH_4$), oxygen ($O_2$), and nitrogen ($N_2$), such that the first protective layer 44 and the second protective layer 46 are some alternating combination of silicon nitride (SiN) and silicon-oxy-nitride (SiON). In general, a single protective layer formed from silane ($SiH_4$) and nitrogen ($N_2$) or silane ($SiH_4$), oxygen ($O_2$), and nitrogen ($N_2$) may be used, or alternating layers of the same may be used to form multiple protection layers.

Figure 6D:
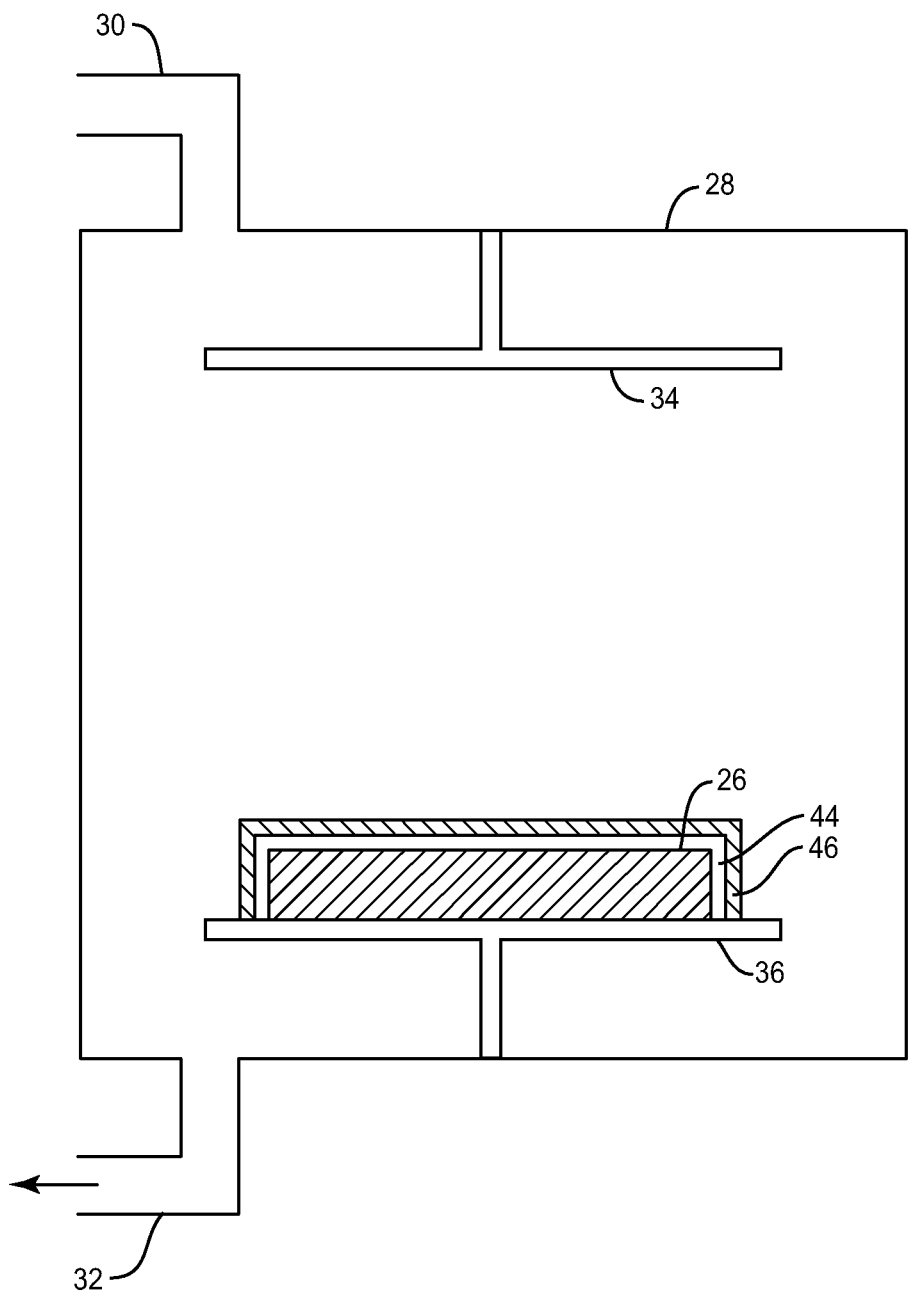
Figure 6E:
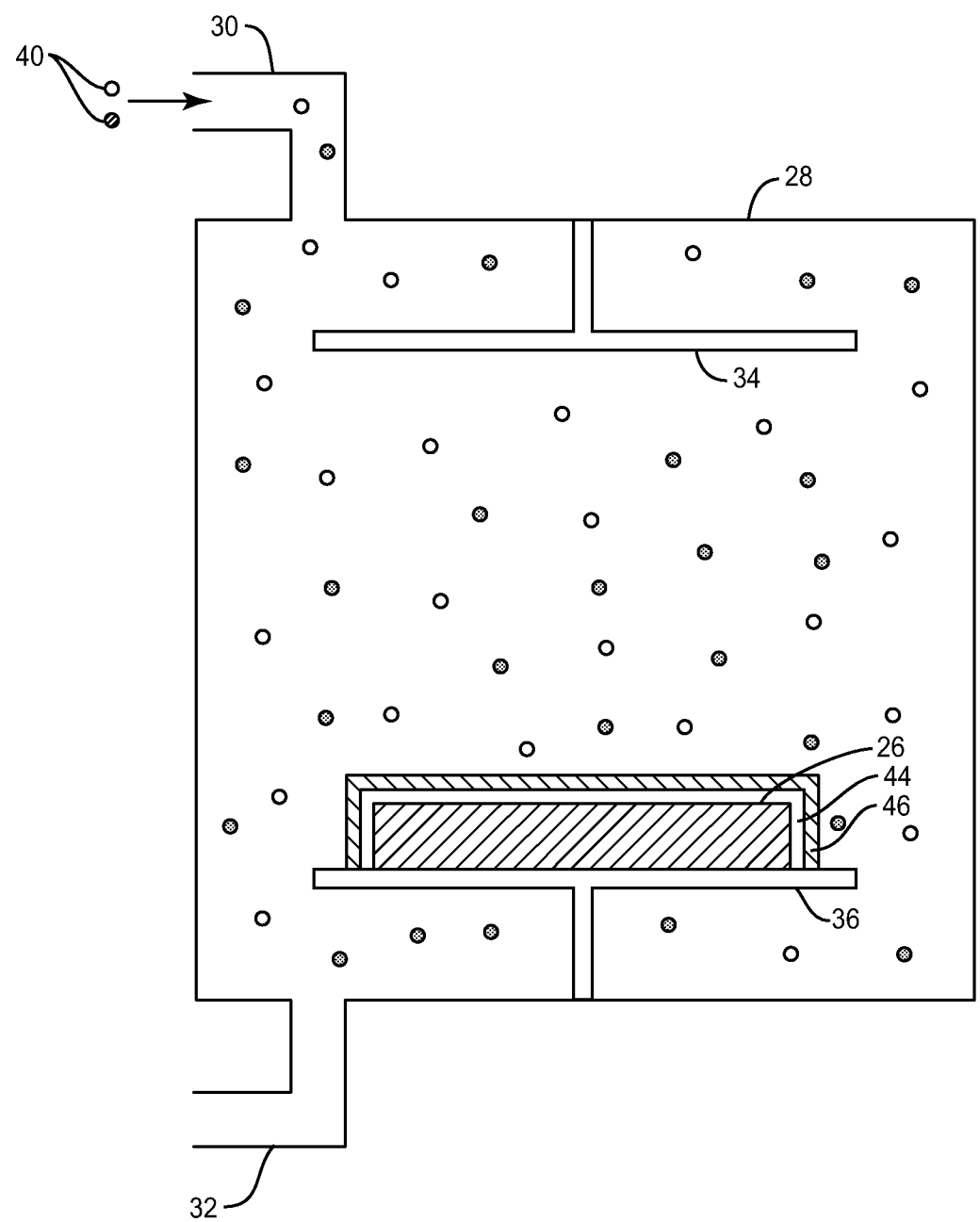

Continuing the exemplary process described above, the PECVD chamber 28 may be cleared once again, such that the reactants used to form the second protective layer 46 are removed from the PECVD chamber 28, for example, via the exhaust port 32 (step 306 and FIG. 6D). Additional reactants are then once again provided into the PECVD chamber 28 (step 308 and FIG. 6E). As discussed above, the additional reactants used are different than those used to deposit the last protective layer. In this case, the additional reactants are different than those used to deposit the second protective layer 46. In one embodiment, the additional reactants are silane ($SiH_4$) and nitrogen ($N_2$), however, any suitable reactants may be used without departing from the principles of the present disclosure.

Figure 6F:
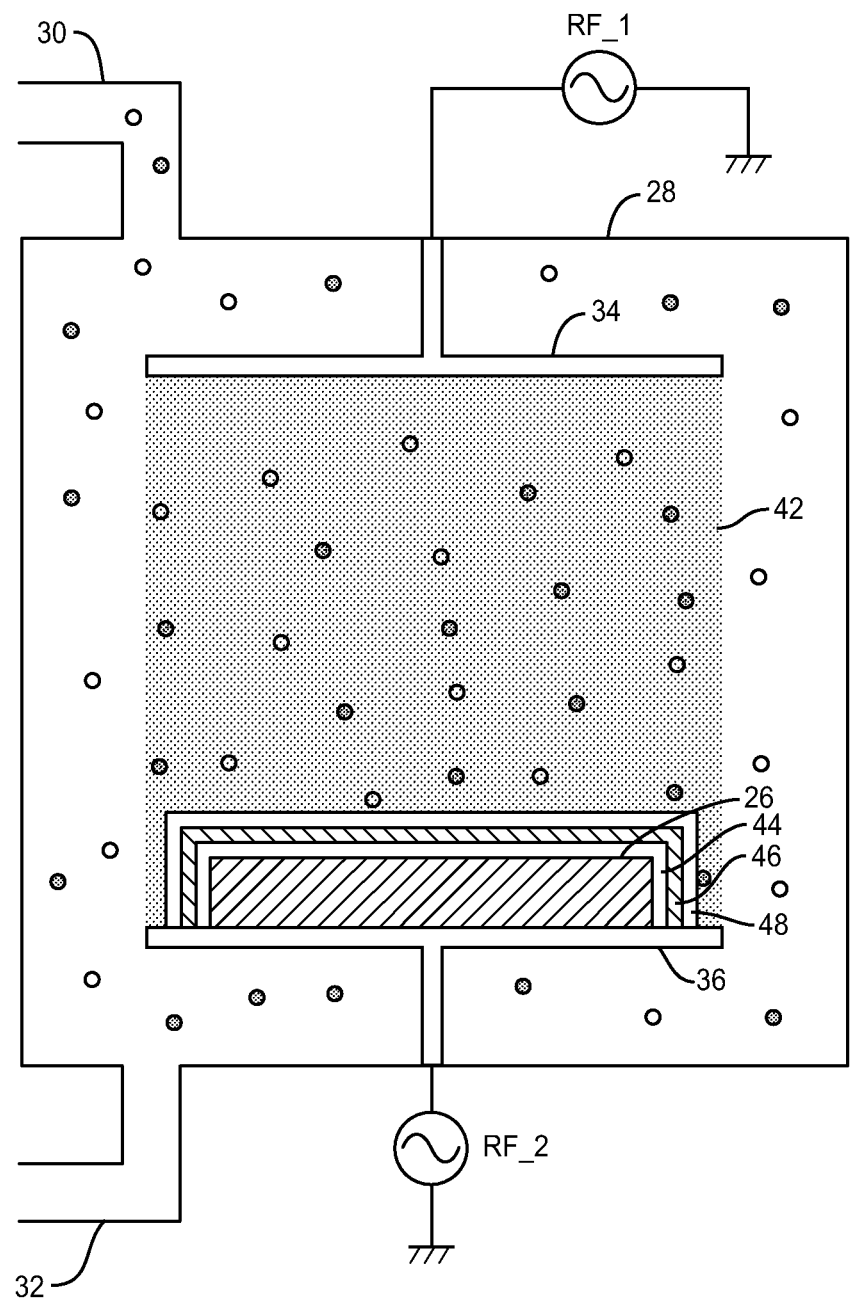

Once again, a first RF signal RF_1 is provided to the top electrode 34 of the PECVD chamber 28 (step 310 and FIG. 6F). As discussed above, the first RF signal RF_1 effectively ionizes the reactants in the PECVD chamber 28 and thus forms a plasma 42 below the top electrode 34, represented by the shaded area in FIG. 6F. The resulting reactive radicals, ions, and neutral atoms interact with the second protective layer 46, the first protective layer 44, and/or the semiconductor body 26 to deposit a third protective layer 48 over the second protective layer 46. In one embodiment, a second RF signal RF_2 is simultaneously provided to the bottom electrode 36 of the PECVD chamber 28. As discussed above, the first RF signal RF_1 may be a high frequency RF signal with a frequency of about 13.45 MHz while the second RF signal RF_2 may be a low frequency RF signal with a frequency of about 20 kHz. Providing the second RF signal RF_2 to the bottom electrode 36 may accelerate the various ions and reactive radicals into the second protective layer 46, the first protective layer 44, and/or the semiconductor body 26, essentially resulting in ion bombardment of the second protective layer 46, the first protective layer 44, and/or the semiconductor body 26. This ion bombardment has a compacting effect on the third protective layer 48 and thus reduces stress in the layer. Accordingly, providing the second RF signal RF_2 to the bottom electrode 36 may reduce buckling and warping of the third protective layer 48 as well as delamination and/or cracks in the surface of the layer due to warping and buckling. The first RF signal RF_1 and the second RF signal RF_2 may be the same as those used above to deposit the first protective layer 44, the second protective layer 46, or may differ based on the reactants used to deposit the various protective layers.

The first protective layer 44, the second protective layer 46, and the third protective layer 48 may be referred to in general as a single protective layer. The protective layer may be used as a passivation layer to cover one or more reactive surfaces of the semiconductor body 26 or as an environmental encapsulation layer. Further, the protective layer may be provided numerous times throughout the manufacture of a semiconductor device such that the protective layer is located between various layers of the semiconductor device.

The processes above may generate extremely robust protective layers using PECVD. Specifically, protective layers produced by the foregoing processes are capable of preserving the functionality of a semiconductor device throughout temperature humidity with bias (THB) tests exceeding 1000 hours. In one embodiment, protective layers produced by the foregoing processes are capable of preserving the functionality of a semiconductor device throughout THB tests exceeding 1500 hours. THB tests generally involve providing a semiconductor device along with any protective layers into a test chamber with a controlled temperature and relative humidity. In the case of THB tests, standards dictate that the test chamber should be about 85° with a relative humidity of about 85% (i.e., 85/85 THB tests). Further, a bias condition is applied to the semiconductor device, which may vary depending on the device under test (DUT). In one embodiment, the semiconductor device is a transistor. In such an embodiment, a bias voltage of −8V may be applied between a gate contact and a source contact of the device and a bias voltage of 50V may be applied to a drain contact of the device during the THB tests. Details of THB testing are described in IEC standard 749, the contents of which are hereby incorporated by reference in their entirety.

In one embodiment, protective layers produced by the foregoing processes are capable of preserving the functionality of a semiconductor device throughout a highly accelerated stress test (HAST) exceeding 96 hours. In an additional embodiment, protective layers produced by the foregoing processes are capable of preserving the functionality of a semiconductor device throughout a HAST exceeding 144 hours, and even 192 hours in some embodiments. HAST tests generally involve providing a semiconductor device along with any protective layers into a test chamber with a controlled temperature, relative humidity, and pressure. In one embodiment, the chamber for a HAST test has a temperature of about 130° C., a relative humidity of 85%, and a pressure around 33.4 psia (pounds per square inch absolute). Further, a bias condition is applied to the semiconductor device, which may vary depending on the DUT. As discussed above, the semiconductor device may be a transistor. In such an embodiment, a bias voltage of −8V may be applied between a gate contact and a source contact of the device and a bias voltage of 50V may be applied to a gate contact of the device during a HAST. Details of HAST are described in detail in Test Method A110-B published by the Electronic Industries Alliance, the contents of which are hereby incorporated by reference in their entirety.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor device comprising a plasma-enhanced chemical vapor deposition (PECVD) protective layer configured to prevent failure of the semiconductor device throughout a temperature humidity with bias (THB) test exceeding about 1000 hours, wherein the PECVD protective layer comprises alternating layers of silicon nitride (SiN) and silicon-oxy-nitride (SiON).

2. The semiconductor device of claim 1 wherein the PECVD protective layer is configured to prevent failure of the semiconductor device throughout a THB test exceeding about 1500 hours.

3. The semiconductor device of claim 1 wherein the THB test is performed at about 85° C. and about 85% relative humidity.

4. The semiconductor device of claim 1 wherein the semiconductor device is a transistor.

5. The semiconductor device of claim 4 wherein a gate-to-source voltage of the semiconductor device is biased at about −8V and a drain voltage of the device is biased at about 50V throughout the THB test.

6. The semiconductor device of claim 1 wherein the semiconductor device is a gallium nitride (GaN) device.

7. The semiconductor device of claim 1 wherein a first layer of the PECVD protective layer on the semiconductor device is SiN and a second layer of the PECVD protective layer on the first layer is SiON.

8. A semiconductor device comprising a plasma-enhanced chemical vapor deposition (PECVD) protective layer configured to prevent failure of the semiconductor device throughout a highly accelerated stress test (HAST) exceeding about 96 hours, wherein the PECVD protective layer comprises alternating layers of silicon nitride (SiN) and silicon-oxy-nitride (SiON) and is formed using only silane ($SiH_4$), oxygen ($O_2$), and nitrogen ($N_2$) such that a concentration of $SiH_4$ to $N_2$ during the formation of the PECVD protective layer is between 1:100 and 1:1000.

9. The semiconductor device of claim 8 wherein the PECVD protective layer is configured to prevent failure of the semiconductor device throughout a HAST exceeding about 144 hours.

10. The semiconductor device of claim 8 wherein the PECVD protective layer is configured to prevent failure of the semiconductor device throughout a HAST exceeding about 192 hours.

11. The semiconductor device of claim 8 wherein the HAST test is performed at about 130° C., about 85% relative humidity, and about 33 psia (pounds per square inch absolute).

12. The semiconductor device of claim 8 wherein the semiconductor device is a transistor.

13. The semiconductor device of claim 12 wherein a gate-to-source voltage of the semiconductor device is biased at about −8V and a drain voltage of the device is biased at about 50V throughout the HAST test.

14. The semiconductor device of claim 8 wherein the semiconductor device is a gallium nitride (GaN) device.

15. A method of manufacturing a monolithic microwave integrated circuit (MMIC) comprising:
   providing the MMIC in a plasma-enhanced chemical vapor deposition (PECVD) chamber;
   cleaning at least a surface of the MMIC within the PECVD chamber; and
   providing a PECVD protective layer on the MMIC, wherein the PECVD protective layer is configured to prevent failure of the MMIC throughout a temperature humidity with bias (THB) test exceeding about 1000 hours.

* * * * *